(12) United States Patent
Kong et al.

(10) Patent No.: US 12,143,251 B2
(45) Date of Patent: Nov. 12, 2024

(54) MULTI-LEVEL OUTPUT DRIVING CIRCUIT AND METHOD

(71) Applicant: SANECHIPS TECHNOLOGY CO., LTD, Shenzhen (CN)

(72) Inventors: Mingjie Kong, Shenzhen (CN); Xiongjie Shen, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 193 days.

(21) Appl. No.: 18/012,289

(22) PCT Filed: May 25, 2021

(86) PCT No.: PCT/CN2021/095893
§ 371 (c)(1),
(2) Date: Dec. 22, 2022

(87) PCT Pub. No.: WO2021/258963
PCT Pub. Date: Dec. 30, 2021

(65) Prior Publication Data
US 2023/0261913 A1 Aug. 17, 2023

(30) Foreign Application Priority Data
Jun. 23, 2020 (CN) .......................... 202010583730.4

(51) Int. Cl.
*H04L 25/49* (2006.01)
*H04L 25/03* (2006.01)

(52) U.S. Cl.
CPC .... *H04L 25/4917* (2013.01); *H04L 25/03038* (2013.01)

(58) Field of Classification Search
CPC .... H03K 7/02; H03K 17/687; H03K 19/0002; H03M 1/00; H04B 14/023; H04L 25/03038; H04L 25/4917
See application file for complete search history.

(56) References Cited

U.S. PATENT DOCUMENTS

| 8,742,965 | B1 | 6/2014 | Cosand |
| 2004/0066856 | A1* | 4/2004 | Forestieri ............. H04L 25/497 |
| | | | 375/295 |
| 2023/0412434 | A1* | 12/2023 | Dickson ................. H04L 27/04 |

FOREIGN PATENT DOCUMENTS

| CN | 104767524 A | 7/2015 |
| CN | 105553565 A | 5/2016 |

(Continued)

OTHER PUBLICATIONS

International Search Report for corresponding application PCT/CN2021/095893 filed May 25, 2021; Report dated Jul. 26, 2021.

*Primary Examiner* — David B Lugo
(74) *Attorney, Agent, or Firm* — CANTOR COLBURN LLP

(57) ABSTRACT

Provided are a multilevel output drive circuit and method. The circuit includes: a signal selection module, configured to selectively output a signal to be transmitted of a corresponding channel according to an external input signal; a weight generation module, configured to generate weight data according to a weight of an output eye diagram, wherein the weight of the output eye diagram and the weight data are multi-bit binary data; a coefficient transfer module, configured to perform weight control on the signal to be transmitted according to the weight data and generate data containing weight information; and a weight adjustment and data outputting module, configured to perform weight adjustment and pulse amplitude modulation calculation according to weight adjustment control data, the signal to be transmitted and the data containing weight information, and generate PAM4 data.

20 Claims, 7 Drawing Sheets

(56) References Cited

FOREIGN PATENT DOCUMENTS

| CN | 106712773 A | 5/2017 |
|----|-------------|--------|
| CN | 110855295 A | 2/2020 |
| CN | 110971232 A | 4/2020 |
| CN | 111049520 A | 4/2020 |

* cited by examiner

MULTI-LEVEL OUTPUT DRIVING CIRCUIT AND METHOD

CROSS-REFERENCE TO RELATED APPLICATION

This disclosure is based upon and claims priority to Chinese Patent Application 202010583730.4, filed on Jun. 24, 2020, the entire contents of which are incorporated herein by reference.

Technical Field

The present disclosure relates to the technical field of communications, in particular, to a multilevel output drive circuit and method.

BACKGROUND

With the evolution of the signal transmission rate from 28G to a higher rate, the use of traditional single-channel modulation is limited. A Pulse Amplitude Modulation (PAM) signal can adopt multiple signal levels, so that more bits of digital signals can be transmitted in each signal cycle, thus greatly increasing the transmission rate. Therefore, PAM level-4 (PAM4) came into being. A PAM4 signal is composed of four levels. Each signal cycle can transmit 2 bits of signals. Compared with that of the traditional single-channel modulation, the transmission rate is doubled. In the prior art, an eye diagram analysis method can be used to analyze whether a PAM4 signal is attenuated and deteriorated. Due to a higher transmission rate, the PAM4 signal will be lost in the transmission process, which makes an eye diagram of the existing PAM4 signal have a problem of disorder.

SUMMARY

Embodiments of the present disclosure mainly aim to provide a multilevel output drive circuit and method.

In order to achieve the above objective, an embodiment of the present disclosure provides a multilevel output drive circuit. The circuit includes: a signal selection module, configured to selectively output a signal to be transmitted of a corresponding channel according to an external input signal; a weight generation module, configured to generate weight data according to a weight of an output eye diagram, wherein the weight of the output eye diagram and the weight data are multi-bit binary data; a coefficient transfer module, configured to perform weight control on the signal to be transmitted according to the weight data and generate data containing weight information; and a weight adjustment and data outputting module, configured to perform weight adjustment and pulse amplitude modulation calculation according to weight adjustment control data, the signal to be transmitted and the data containing weight information, and generate PAM4 data.

In order to achieve the above objective, an embodiment of the present disclosure provides a multilevel output drive method. The method is applicable to the multilevel output drive circuit. The method includes the following steps: controlling and selectively outputting, by the signal selection module, a signal to be transmitted of a corresponding channel according to an external input signal; generating, by the weight generation module, weight data according to a weight of an output eye diagram, wherein the weight of the output eye diagram and the weight data are multi-bit binary data; performing, by the coefficient transfer module, weight control on the signal to be transmitted according to the weight data, and generating data containing weight information; and performing, by the weight adjustment and data outputting module, weight adjustment and pulse amplitude modulation calculation according to weight adjustment control data, the signal to be transmitted and the data containing weight information, and generate PAM4 data.

DETAILED DESCRIPTION OF THE EMBODIMENTS

Figure 1:
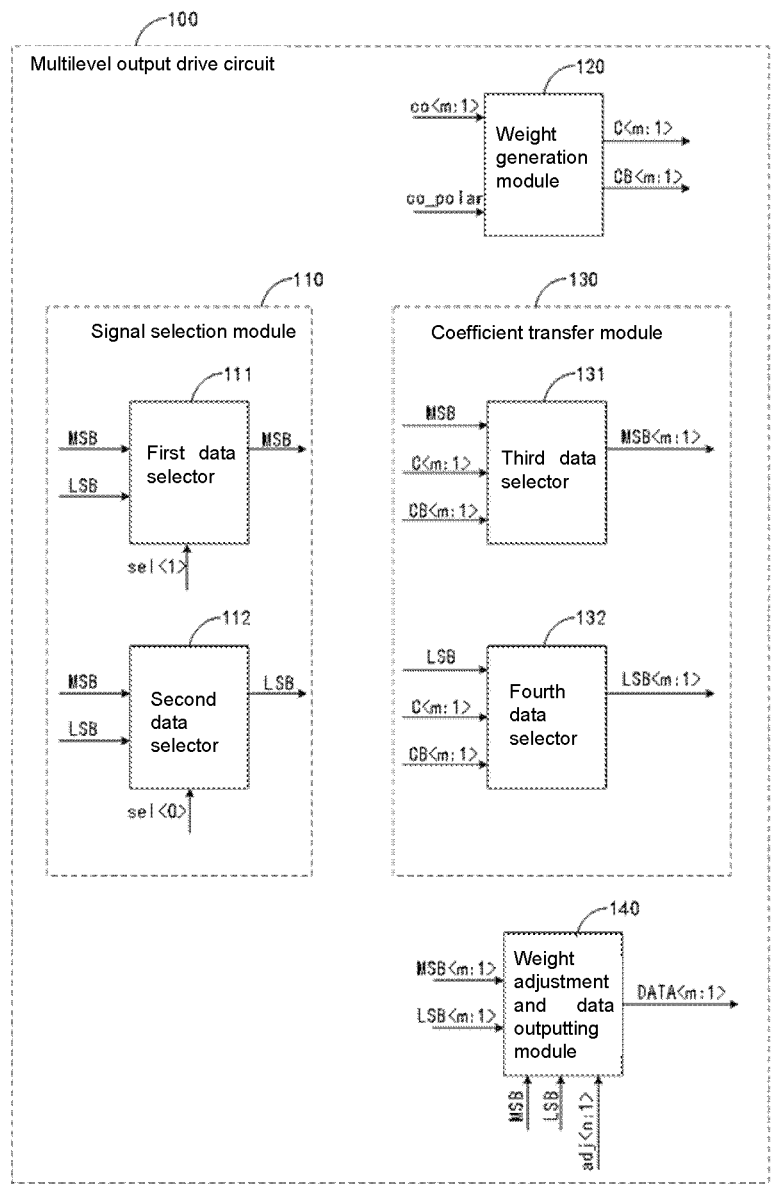
FIG. 1 is a schematic structural diagram of a multilevel output drive circuit provided by an embodiment of the present disclosure.

The present disclosure is further described in detail below in combination with the drawings and embodiments. It can be understood that the specific embodiments described herein are only used to explain the present disclosure, not intended to define the present disclosure. In addition, it should be also noted that for the convenience of description, only part of structures, but not all structures, related to the present disclosure are shown in the drawings.

An embodiment of the present disclosure provides a multilevel output drive circuit, which can be applied to a high-speed Serdes circuit to achieve one-way adjustment of an output eye diagram. FIG. 1 is a schematic structural diagram of a multilevel output drive circuit provided by an embodiment of the present disclosure. Referring to FIG. 1, the multilevel output drive circuit 100 includes a signal selection module 110, a weight generation module 120, a coefficient transfer module 130 and a weight adjustment and data outputting module 140. The signal selection module 110 is configured to selectively output a signal to be transmitted of a corresponding channel according to an external input signal. The weight generation module 120 is configured to generate weight data according to a weight of an output eye diagram. The weight of the output eye diagram and the weight data are both multi-bit binary data. The coefficient transfer module 130 is configured to perform weight control on the signal to be transmitted according to the weight data, and generate data containing weight information. The weight adjustment and data outputting module 140 is configured to perform weight adjustment and pulse amplitude modulation calculation according to weight adjustment control data, the signal to be transmitted and the data containing weight information, and generate PAM4 data.

An input end of the signal selection module 110 receives the external input signal, and the signal selection module 110 inputs a Most Significant Bit (MSB) and a Least Significant bit (LSB). At least two output ends of the signal selection module 110 respectively output the signals to be transmitted MSB/LSB of the corresponding channels, and transmit the signals to be transmitted MSB/LSB to the coefficient transfer module 130 and the weight adjustment and data outputting module 140. In this way, data preparation can be achieved by configuring the signal selection module 110.

An input end of the weight generation module 120 receives the output eye diagram weight, and the output eye diagram weight includes initial weight data co<m: 1> and a weight polarity co polar. The output eye diagram weight is multi-bit binary data, which means that the initial weight data co<m: 1> is multi-bit binary data, and m is a natural number. In an embodiment, m≥7 is used to convert MSB and LSB into higher-bit binary data to improve the accuracy of signal transmission. The output eye diagram weight co<m: 1>/copolar determines an initial weight of each signal to be transmitted MSB/LSB, thus determining an eye height of each eye in the eye diagram. An output end of the weight generation module 120 outputs weight data C<m: 1>/CB<m: 1>, and the weight data C<m: 1>/CB<m: 1> is output to the coefficient transfer module 130. The output eye diagram weight is multi-bit binary data. Correspondingly, the weight data is multi-bit binary data. The weight data includes a maximum weight code value C<m: 1> and a maximum weight code value complement CB<m: 1>.

An input end of the coefficient transfer module 130 receives the signals to be transmitted MSB/LSB output by the signal selection module 110 and the weight data C<m: 1>/CB<m: 1> output by the weight generation module 120. The coefficient transfer module 130 combines the data to be transmitted MSB/LSB, and calculates the data to be transmitted MSB/LSB and the weight data C<m: 1>/CB<m: 1> to determine the data containing weight information. The data containing weight information includes high-bit data MSB<m: 1> containing weight information and low-bit data LSB<m: 1> containing weight information. An output end of the coefficient transfer module 130 outputs the data MSB<m: 1>/LSB<m: 1> containing weight information to the weight adjustment and data outputting module 140.

An input end of the weight adjustment and data outputting module 140 receives the signal to be transmitted MSB/LSB output by the signal selection module 110, the data MSB<m: 1>/LSB<m: 1> containing weight information output by the coefficient transfer module 130, and weight adjustment control data adj<n: 1>. The value of the weight adjustment control data adj<n: 1> determines whether to perform weight adjustment on the data MSB<m: 1>/LSB<m: 1> containing weight information. Since the data MSB<m: 1>/LSB<m: 1> containing weight information is multi-bit binary data, the weight adjustment control data adj<n: 1> can perform the weight adjustment on one or more bits of the data MSB<m: 1>/LSB<m: 1> containing weight information. If the weight adjustment control data adj<n: 1> is valid, the weight adjustment and data outputting module 140 calculates the data MSB<m: 1>/LSB<m: 1> containing weight information, the signal to be transmitted MSB/LSB and the weight adjustment control data adj<n: 1> to obtain PAM4 data with weight-adjustable information. The PAM4 data after weight adjustment is transmitted to a signal transmission module (TX) for parallel to serial transmission.

For example, a working process of the multilevel output drive circuit 100 is as follows: The coefficient transfer module 130 calculates the weight data C<m: 1>/CB<m: 1> output by the signal selection module 110 and the weight data C<m: 1>/CB<m: 1> output by the weight generation module 120, so as to generate two m-bit binary codes containing low and high-level information in the signal to be transmitted MSB/LSB, that is, the data MSB<m: 1>/LSB<m: 1> containing weight information. When the weight adjustment control data aj<n: 1> is not 0, code value adjustment is performed so that weights corresponding to the m-bit binary codes for level transmission are added with aj<n: 1>. The m-bit data of LSB is divided by 2, and full addition is then performed on the divided m-bit data of LSB and the m-bit data of MSB. Since MSB/LSB contains both low and high-level signals, the PAM4 containing four pieces of level information is obtained after summation. Details are shown in Table 1.

TABLE 1

| MSB | LSB | MSB + LSB/2 |
|-----|-----|-------------|
| 0   | 0   | 0           |
| 0   | 1   | 1/2         |
| 1   | 0   | 1           |
| 1   | 1   | 3/2         |

The weight adjustment of the PAM4 is the adjustment of the eye height in the eye diagram. For example, whether the weight adjustment control data adj<n: 1> is valid can be determined according to an actual eye diagram and a simulation result. A level separation mismatch ratio (RLM) refers to a ratio of a minimum eye height to an average eye height in a plurality of eyes formed when two or more pulse level signals are transmitted. It is a quantity that indicates whether the eye diagram distribution is ideal. The eye diagram distribution is more ideal if the RLM is closer to 1. For the PAM4, the eye diagram distribution includes three eye heights which are equal under ideal conditions. However, due to different attenuations caused by a channel to different levels, the eye diagram distribution changes. If the eye height in the middle eye diagram increases or decreases, the RLM is smaller, this cannot meet the requirements of signal transmission. At this time, by setting the weight adjustment control data aj<n: 1> to be valid, the eye height in the eye diagram can be adjusted. For example, the eye height in the middle eye diagram decreases, and the eye heights in the upper and lower eye diagrams increase. Therefore, the RLM can be adjusted by means of adjusting the eye height, so that the RLM is greater than 0.96. In an embodiment, the RLM is greater than 0.98.

This embodiment of the present disclosure adopts a DAC digital mode to realize the weight adjustment. By means of setting the weight adjustment and data outputting module 140 in the multilevel output drive circuit to perform weight adjustment and pulse amplitude modulation calculation on the data MSB<m: 1>/LSB<m: 1> containing weight information, thus achieving the objective of adjusting the level of the generated pulse amplitude modulation data. Compared with simulated eye diagram adjustment, this embodiment of the present disclosure can not only decrease the eye height in the middle eye diagram, but also increase the eye height in the upper and lower eye diagram, which can more widely deal with the problem of imbalance of the RLM of the eye diagram caused by different transmission environments. In addition, this embodiment of the present disclosure transmits data signals in the form of binary, in which the change of a transmission level corresponding to one code value is very small, allowing more accurate fine adjustment of the eye diagram. In addition, the calculation process in the principle of this embodiment of the present disclosure has no requirement on the transmission rate, and the power consumption is determined by the rate of the signal to be transmitted. The adjustment process does not have additional power consumption, and the calculation requirement is low.

Continuing to refer to FIG. 1, in an embodiment, the signal selection module 110 includes a first data selector 111 and a second data selector 112. A control end of the first data selector 111 is configured to input a high-bit selection control signal sel<1>. A first data input end of the first data selector 111 is configured to input the MSB, and a second data input end of the first data selector 111 is configured to input the LSB. An output end of the first data selector 111 outputs the MSB, that is, the first data selector 111 selectively outputs the MSB. A control end of the second data selector 112 is configured to input a low-bit selection control signal sel<0>. A first data input end of the second data selector 112 is configured to input the MSB, and a second data input end of the second data selector 112 is configured to input the LSB. An output end of the first data selector 112 outputs the LSB, that is, the second data selector 112 selectively outputs the LSB.

Continuing to refer to FIG. 1, in an embodiment, the coefficient transfer module 130 includes a third data selector 131 and a fourth data selector 132. A control end of the third data selector 131 is configured to input the MSB. A first data input end of the third data selector 131 is configured to input C<m: 1>, and a second data input end of the third data selector 131 is configured to input CB<m: 1>. An output end of the third data selector 131 outputs MSB<m: 1>, MSB<m: 1> is C<m: 1> or CB<m: 1>, which can be determined according to the value of the MSB. A control end of the fourth data selector 132 is configured to input the LSB. A first data input end of the fourth data selector 132 is configured to input C<m: 1>, and a second data input end of the fourth data selector 132 is configured to input CB<m: 1>. An output end of the fourth data selector 132 outputs LSB<m: 1>. LSB<m: 1> is C<m: 1> or CB<m: 1>, which can be determined according to the value of the LSB.

Figure 2:
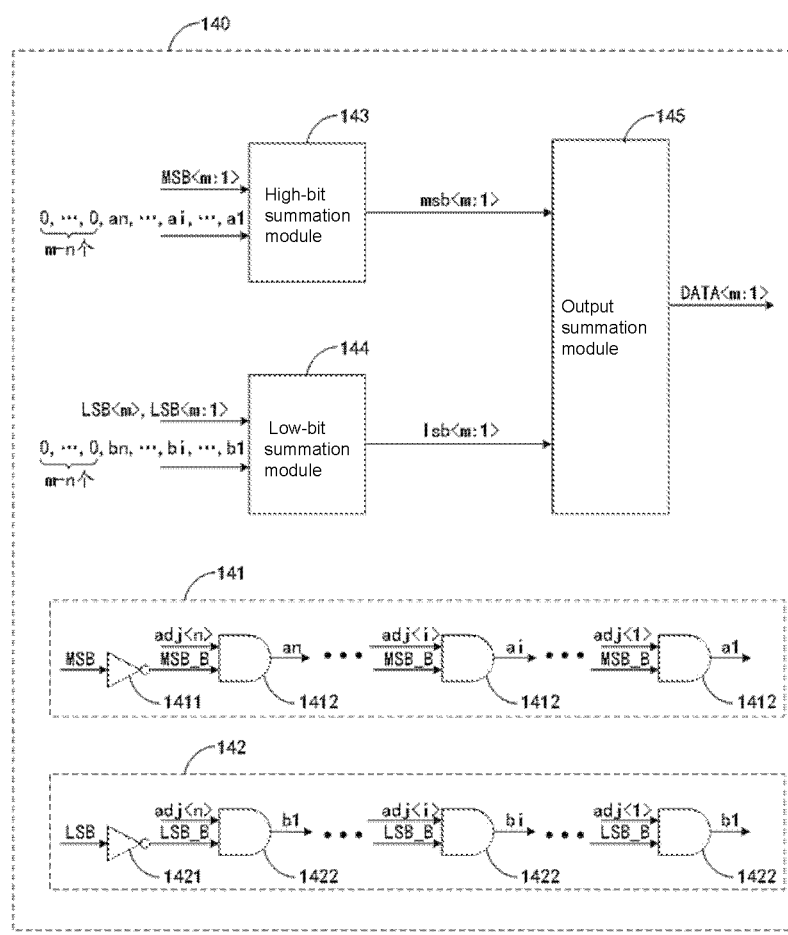
FIG. 2 is a schematic structural diagram of a weight adjustment and data outputting module provided by an embodiment of the present disclosure.

FIG. 2 is a schematic structural diagram of a weight adjustment and data outputting module provided by an embodiment of the present disclosure. Referring to FIG. 2, in an embodiment, the weight adjustment and data outputting module 140 includes a high-bit weight adjustment module 141, a low-bit weight adjustment module 142, a high-bit summation module 143, a low-bit summation module 144, and an output summation module 145. The high-bit weight adjustment module 141 is configured to generate high-bit weight adjustment code values a1 ... an according to the MSB and the weight adjustment control data adj<n: 1>, and n is a positive integer. The low-bit weight adjustment module 142 is configured to generate low-bit weight adjustment code values b1 ... bn according to the LSB and the weight adjustment control data adj<n: 1>. The high-bit summation module 143 is configured to recombine the high-bit weight adjustment code values with 0 to obtain m bits of high-bit weight adjustment data $$\underbrace{0, \ldots, 0,}_{m-n}$$

an, ..., ai, ..., a1, and sum MSB<m: 1> with the high-bit weight adjustment data $$\underbrace{0, \ldots, 0,}_{m-n}$$

an, ..., ai, ..., a1 to obtain a high-bit adjustment signal msb<m: 1>. The low-bit summation module 144 is configured to recombine the low-bit weight adjustment code values with 0 to obtain m bits of low-bit weight adjustment data $$\underbrace{0, \ldots, 0,}_{m-n}$$

bn, ..., bi, ..., b1, and sum the LSB<m: 1> with the low-bit weight adjustment data $$\underbrace{0, \ldots, 0,}_{m-n}$$

bn, ..., bi, ..., b1 to obtain a low-bit adjustment signal lsb<m: 1>. The output summation module 145 is configured to sum msb<m: 1> with lsb<m: 1> to obtain PAM4.

A first input end of the high-bit summation module 143 is configured to input MSB<m: 1>. A second input end of the high-bit summation module 143 is configured to input $$\underbrace{0, \ldots, 0,}_{m-n}$$

an, ..., ai, ..., a1, and an output end of the high-bit summation module 143 outputs msb<m: 1>. A first input end of the low-bit summation module 144 is configured to input LSB<m: 1>. A second input end of the low-bit summation module 144 is configured to input $$\underbrace{0, \ldots, 0,}_{m-n}$$

bn, bi, ..., b1, and an output end of the low-bit summation module 144 outputs lsb<m: 1>.

In the above embodiment, dividing the LSB by 2 can be performed before or after the weight adjustment of LSB<m: 1>, or after the weight adjustment of LSB<m: 1>, that is, lsb<m: 1> can be data after dividing LSB<m: 1> by 2 or data before dividing LSB<m: 1> by 2. For example, it needs to be determined according to the value of n. If the LSB is divided by 2 before the weight adjustment of LSB<m: 1>, LSB<m> and LSB<m: 1> can be input to the second input end of the low-bit summation module 144. In this way, LSB<m: 1> can be summed with $$\underbrace{0, \ldots, 0,}_{m-n}$$

bn, ..., bi, ..., b1 after being divided by 2, and lsb<m: 1> obtained is the data after the LSB<m: 1> is divided by 2. If LSB is divided by 2 after the weight adjustment of LSB<m: 1>, 1sb<m: 1> obtained is the data before LSB<m: 1> is divided by 2, and 1sb<m: 1> can be divided by 2 in the output summation module 145.

On the basis of the above embodiments, several values of n will be described in detail below, but will not be used as a limitation to the present disclosure.

Referring to FIG. 2 again, in an embodiment, n≥2. The high-bit weight adjustment module 141 includes a first NOT gate 1411 and third AND gates 1412 at levels from 1 to n. An input end of the first NOT gate 1411 is configured to input the MSB, and an output end of the first NOT gate 1411 outputs inverse data MSB_B of the MSB. A first input end of the first level of third AND gate 1412 is configured to input the weight adjustment control data adj<1>, and a second input end of the first level of third AND gate 1412 is configured to input the MSB_B. An output end of the first level of third AND gate 1412 outputs the first level of high-bit weight adjustment code value a1. A first input end of the ith level of third AND gate 1412 is configured to input the weight adjustment control data adj<i>, and a second input end of the ith level of third AND gate 1412 is configured to input the MSB_B. An output end of the ith level of third AND gate 1412 outputs the ith level of high-bit weight adjustment code value ai, and i is a positive integer, 1<i<n. A first input of the nth level of third AND gate 1412 is configured to input the weight adjustment control data adj<n>, and a second input of the nth level of third AND gate 1412 is configured to input the MSB_B. An output end of the nth level of third AND gate 1412 outputs the nth level of high-bit weight adjustment code value a(n).

The low-bit weight adjustment module 142 includes a second NOT gate 1421 and fourth AND gates 1422 at levels from 1 to n. An input end of the second NOT gate 1421 is configured to input the LSB, and an output end of the second NOT gate 1421 outputs inverse data LSB_B of the LSB. A first input end of the first level of fourth AND gate 1422 is configured to input the weight adjustment control data adj<1>, and a second input end of the first level of fourth AND gate 1422 is configured to input the LSB_B. An output end of the first level of fourth AND gate 1422 outputs the first level of low-bit weight adjustment code value b1. A first input end of the ith level of fourth AND gate 1422 is configured to input the weight adjustment control data adj<i>, and a second input end of the ith level of fourth AND gate 1422 is configured to input the LSB_B. An output end of the ith level of fourth AND gate 1422 outputs the ith level of low-bit weight adjustment code value bi, and i is a positive integer, 1<i<n. A first input end of the nth level of fourth AND gate 1422 is configured to input the weight adjustment control data adj<1>, and a second input end of the nth level of fourth AND gate 1422 is configured to input the LSB_B. An output end of the nth level of fourth AND gate 1422 outputs the nth level of low-bit weight adjustment code value b(n).

5 Continuing to refer to FIG. 2, in an embodiment, a first input end of the high-bit summation module 143 is configured to input MSB<m: 1>. A second input end of the high-bit summation module 143 is configured to input $$\underbrace{0, \ldots, 0}_{m-n},$$

an, . . . , ai, . . . , a1, and an output end of the high-bit summation module 143 outputs msb<m: 1>. A first input end of the low-bit summation module 144 is configured to input LSB<m> and LSB<m: 1>. A second input end of the low-bit summation module 144 is configured to input $$\underbrace{0, \ldots, 0}_{m-n},$$

bn, b1. The low-bit summation module 144 is configured to sum the LSB<m: 1> with $$\underbrace{0, \ldots, 0}_{m-n},$$

bn, bi, b1 after division by 2. An output end of the low-bit summation module 144 outputs 1sb<m: 1>. A first input end of the output summation module is configured to input msb<m: 1>, and a second input end of the output summation module is configured to input 1sb<m: 1>. The output summation module is configured to perform full addition on 1sb<m: 1> and msb<m: 1> to obtain PAM4.

In this embodiment of the present disclosure, in a case of n≥2, the LSB is divided by 2 before the weight adjustment of LSB<m: 1>, which can avoid a deviation caused by the fact that: the low-bit weight adjustment code values bn, . . . , bi, . . . , b1 is divided by 2 when LSB<m: 1> is divided by 2, but the high-bit weight adjustment code values an, . . . , ai, . . . , a1 are not divided by 2.

Figure 3:
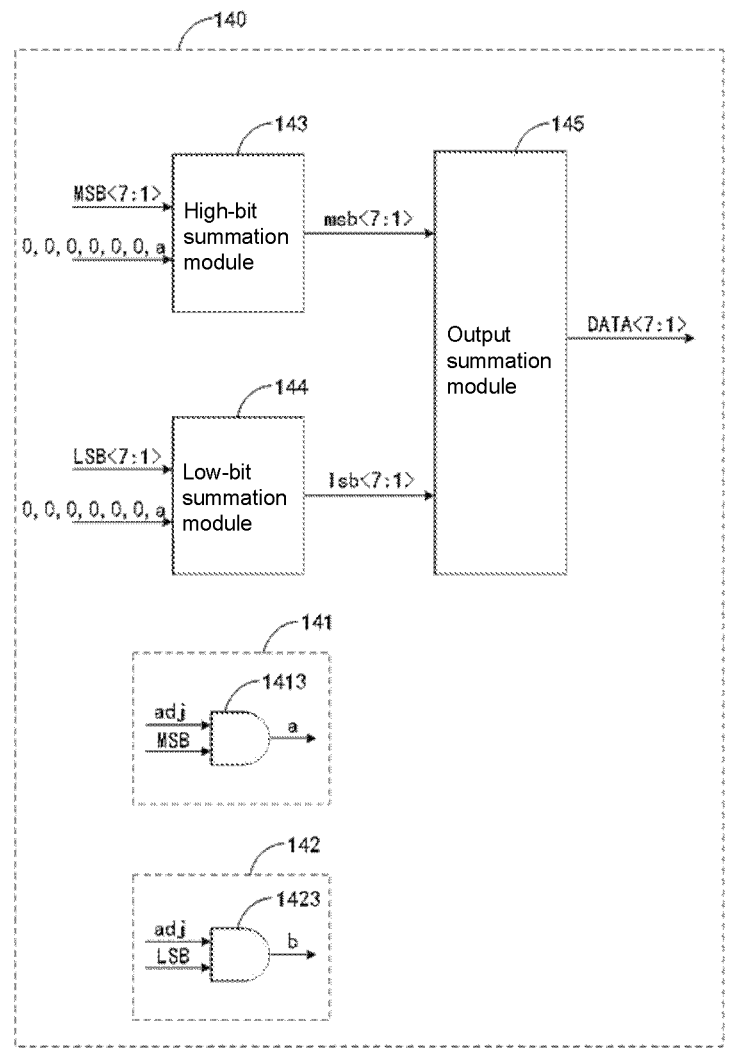
FIG. 3 is a schematic structural diagram of another weight adjustment and data outputting module provided by an embodiment the present disclosure.

FIG. 3 is a schematic structural diagram of another weight adjustment and data outputting module provided by an embodiment the present disclosure. Refer to FIG. 3, in an embodiment, n=1, that is, adj<n: 1> is 1 bit, and the weight of the circuit is adjusted to be 1 bit. The high-bit weight adjustment module 141 includes a first AND gate 1413. A first input end of the first AND gate 1413 is configured to input the weight adjustment control data adj, and a second input end of the first AND gate 1413 is configured to input the MSB. An output end of the first AND gate 1413 outputs the high-bit weight adjustment code value a. The low-bit weight adjustment module 142 includes a second AND gate 1423. A first input end of the second AND gate 1423 is configured to input the weight adjustment control data adj, and a second input end of the second AND gate 1423 is configured to input the LSB. An output end of the second AND gate 1423 outputs the low-bit weight adjustment code value b.

Continuing to refer to FIG. 3, in an embodiment, a first input end of the high-bit summation module 143 is configured to input MSB<m: 1>. A second input end of the high-bit summation module 143 is configured to input $$\underbrace{0, \ldots, 0}_{m-1},$$

a, and an output end of the high-bit summation module 143 outputs msb<m: 1>. A first input end of the low-bit summation module 144 is configured to input LSB<m: 1>. A second input end of the low-bit summation module 144 is configured to input $$\underbrace{0, \ldots, 0}_{m},$$

b, and an output end of the low-bit summation module 144 outputs lsb<m: 1>. A first input end of the output summation module 145 is configured to input msb<m: 1>, and a second input end of the output summation module 145 is configured to input lsb<m: 1>. The output summation module 145 is configured to perform, after lsb<m: 1> is divided by 2, full addition on lsb<m: 1> and msb<m: 1> to obtain DATA<m: 1>. DATA<m: 1> is the PAM4 data.

Referring to FIG. 1 and FIG. 3, m=7 (a digital mode of 7 bits) is taken as an example, that is, MSB<m: 1> is MSB<7: 1>, $$\underbrace{0, \ldots, 0,}_{m-1}$$

a is 0,0,0,0,0,0, a; msb<m: 1> is msb<7:1>, and LSB<m: 1> is LSB<7:1>;

$$\underbrace{0, \ldots, 0,}_{m}$$

b is 0,0,0,0,0,0, b; lsb<m: 1> is lsb<7:1>, and DATA<m: 1> is DATA<7:1>. The working principle of the multilevel output drive circuit is described.

The maximum code value of the 7 bits of data that can be transmitted is 128, and the maximum weight code value of each eye height is 42, that is, co<7:1>=0101010. co<7:1> is set to be 0101010 (42), and adj is set to be 0 (that is, the eye height is not adjusted). The three eyes in the eye diagram are in the same size, and a corresponding weight is 42. If co<7:1> is greater than or equal to 43 and adj is 0 (that is, the eye height is not adjusted), the middle eye becomes bigger, and the corresponding size is equal to the code value of co<7:1>. The upper and lower eyes are reduced by the same code value. When co<7:1> is greater than or equal to 43, adj needs to be set to 0, otherwise the code value overflows and a transmission error occurs. If co<7:1> is less than or equal to 42 and adj is 1 (that is, the eye height is adjusted), compared with adj which is 0, the middle eye is reduced by one code value, and the corresponding sizes of the upper and lower eyes are the same as the code value of co<7:1>.

Specific analysis is made below when the adj is 0 and co<7:1> is 38, 42, 43, 46 respectively. The eye heights of the three eyes from bottom to top are respectively set as $H_1$, $H_2$, and $H_3$.

1) When co<7:1> is 38, and the value of co_polar is positive: 0,
C<7:1> and CB<7:1> output by the weight generation module 120 are 0100110 (38) and 1011010 (90) respectively; MSB<7:1> and LSB<7:1> are respectively 90 and 38; full addition operation is performed on MSB<7:1> (the value of which is 90 or 38) and LSB<7:1> (the value MSB+½ LSB $H_1$=38 of which is 90 or 38) to obtain four states: =7, 45, 83, 121, and $M_2$=38, and $H_3$=38

Therefore, the three eyes are the same in size, and a relative eye height is 38 code values.

2) When co<7:1> is 42, and the value of co_polar is positive: 0,
C<7:1> and CB<7:1> output by the weight generation module 120 are 0101010 (42) and 1010110 (86) respectively; MSB<7:1> and LSB<7:1> are respectively 86 and 42; full addition operation is performed on MSB<7:1> (the value of which is 86 or 42) and LSB<7:1> (the value of which is 86 or 42) to obtain four states:

$$MSB + \frac{1}{2}LSB = 1, 43, 85, 127,$$

and $H_1$=42 $H_2$=42, and $H_3$=42

Therefore, the three eyes are the same in size, and a relative eye height is 42 code values.

3) When co<7:1> is 43, and the value of co_polar is positive: 0,
C<7:1> and CB<7:1> output by the weight generation module 120 are 0101011 (43) and 1010101 (85) respectively; MSB<7:1> and LSB<7:1> are respectively 85 and 43; full addition operation is performed on MSB<7:1> (the value of which is 85 or 43) and LSB<7:1> (the value of which is 85 or 43) to obtain four states:

$$MSB + \frac{1}{2}LSB = 0, 42, 85, 127,$$

and $H_1$=42 $H_2$=43, and $H_3$=42

Therefore, the middle eye is the biggest, and the relative eye height is 43 code values. The eyes on both sides are the same in size, and the relative eye height is 42 code values.

4) When co<7:1> is 46, and the value of co_polar is positive: 0,
C<7:1> and CB<7:1> output by the weight generation module 120 are 0101110 (46) and 1010010 (82) respectively; MSB<7:1> and LSB<7:1> are respectively 82 and 46; full addition operation is performed on MSB<7:1> (the value of which is 82 or 46) and LSB<7:1> (the value of which is 82 or 46) to obtain four states:

$$MSB + \frac{1}{2}LSB = 5, 41, 87, 123,$$

and $H_1$=36, $H_2$=46, and $H_3$=36.

Therefore, the middle eye is the biggest, and the relative eye height is 46 code values. The eyes on both sides are the same in size, and the relative eye height is 36 code values.

Specific analysis is made below when the adj is 1 and co<7:1> is 42.

1) When co<7:1> is 42, and the value of co_polar is positive: 0,
C<7:1> and CB<7:1> output by the weight generation module 120 are 0101010 (42) and 1010110 (86) respectively; MSB<7:1> and LSB<7:1> are 86 and 42 respectively; MSB<7:1> and LSB<7:1> are transmitted to the weight adjustment and data outputting module 140, MSB and adj are summed to obtain a, and LSB and adj are summed to obtain b; MSB<7:1> and 0, 0, 0, 0, 0, 0, a are summed to obtain msb<7:1>; LSB<7:1> and 0, 0, 0, 0, 0, 0, b are summed to obtain lsb<7:1>; and msb<7:1> and lsb<7:1> are 87 and 42 respectively;

$$MSB + \frac{1}{2}LSB = 2, 44, 85, 127$$

which are four states; and $H_1$=42, $H_2$=41, and $H_3$=42.

Therefore, the middle eye is the smallest, and the relative eye height is 41 code values. The eyes on both sides are the same in size, and the relative eye height is 42 code values. Compared with the adj which is 0, if the weights of the two low levels (2 and 44) are added by 1, the code value of the middle eye is reduced by 1, and the upper and lower eyes remain unchanged.

It can be seen from the above analysis that the relationship between the code value of the relative eye height of the output eye diagram and co<7:1> is summarized as follows:

In a case of co<7:1>≤42:

when adj=0:

$$H_1 = H_2 = co<7:1>$$

when adj=1:

$$H_2 = co<7:1> - 1$$

$$H_1 = H_3 = co<7:1>$$

In a case of co<7:1>>43: adj needs to be 0, otherwise the code value overflows.

when adj=0:

$$H_1 = H_3 = 128 - 2*co<7:1>$$

$$H_2 = co<7:1>$$

Therefore, by means of summing MSB and LSB with control bits 0,0,0,0,0,0, a and 0,0,0,0,0,0, b with weight adjustment code value information respectively, a binary data signal msb<7:1>/lsb<7:1> with weight adjustment information is finally obtained. In 1 bit mode, LSB can be divided by 2 before the weight adjustment of LSB<m: 1>, or after the weight adjustment of LSB<m: 1>. This is because for binary data, the lowest bit is 1. In 1 bit mode, even if LSB is divided by 2 after the weight adjustment for LSB<m: 1>, its weight adjustment bit is still 1, and the weight adjustment will not be affected by division by 2.

In an embodiment, for the mode where the LSB is divided by 2 after the weight adjustment of LSB<m: 1>, the high-bit summation module 143 is an adder; the low-bit summation module 144 is an adder; and the output summation module 145 includes an adder. A first input end of the high-bit summation module 143 is configured to input MSB<m: 1>, and a second input end of the high-bit summation module is configured to input $$\underbrace{0, \ldots, 0}_{m-1},$$

a. An output end of the high-bit summation module outputs msb<m: 1>. A first input end of the low-bit summation module 144 is configured to input LSB<m: 1>. A second input end of the low-bit summation module 144 is configured to input $$\underbrace{0, \ldots, 0}_{m-1},$$

b, and an output end of me low-bit summation module 144 outputs 1sb<m: 1>. A first input end of the output summation module 145 is configured to input msb<m: 1>, and a second input end of the output summation module 145 is configured to input 1sb<m: 1>.

The output summation module 145 is configured to perform, after 1sb<m: 1> is divided by 2, full addition on 1sb<m: 1> and msb<m: 1> to obtain PAM4. In this way, LSB<7:1> is first divided by 2 and then fully added with msb<7:1>. Finally, MSB and ½*LSB signals with adjustable code value weights are output.

25 In an embodiment, for the mode where the LSB is divided by 2 before the weight adjustment of LSB<m: 1>, the high-bit summation module 143 is an adder; the low-bit summation module 144 is an adder; and the output summation module 145 includes an adder. A first input end of the high-bit summation module 143 is configured to input MSB<m: 1>, and a second input end of the high-bit summation module 143 is configured to input $$\underbrace{0, \ldots, 0}_{m-1},$$

a. An output end of the high-bit summation module 143 outputs msb<m: 1>. A first input end of the low-bit summation module 144 is configured to input LSB<m> and LSB<m: 1>. A second input end of the low-bit summation module 144 is configured to input $$\underbrace{0, \ldots, 0}_{m-1},$$

b. The low-bit summation module 144 is configured to sum the LSB<m: 1> with $$\underbrace{0, \ldots, 0}_{m-1},$$

b after division by 2. An output end of the low-bit summation module outputs 1sb<m: 1>. A first input end of the output summation module 145 is configured to input msb<m: 1>, and a second input end of the output summation module 145 is configured to input 1sb<m: 1>. The output summation module 145 is configured to perform full addition 1sb<m: 1> with msb<m: 1> to obtain PAM4.

10 It can be seen from the above analysis that this embodiment of the present disclosure transmits data signals in the form of binary, in which the change of a transmission level corresponding to one code value is very small, allowing more accurate fine adjustment of the eye diagram. The 1 bit weight adjustment mode structure provided by this embodiment of the present disclosure achieves decrease the eye height in the middle eye diagram and increase the eye height in the upper and lower eye diagrams.

Figure 4:
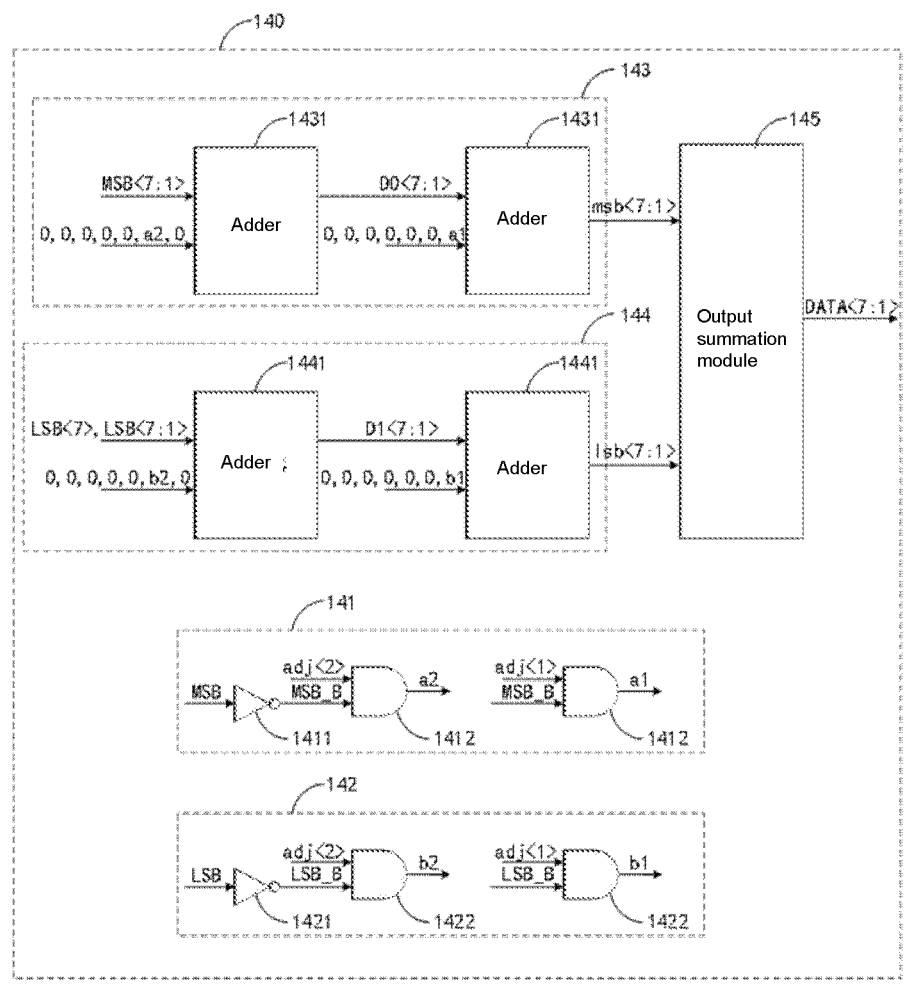
FIG. 4 is a schematic structural diagram of still another weight adjustment and data outputting module provided by an embodiment the present disclosure.

FIG. 4 is a schematic structural diagram of still another weight adjustment and data outputting module provided by an embodiment the present disclosure. Referring to FIG. 4, in an embodiment, n=2, m=7. The high-bit weight adjustment module 141 includes a first NOT gate 1411, a first level of third AND gate 1412 and a second level of third AND gate 1412. The low-bit weight adjustment module 142 includes a second NOT gate 1421, a first level of fourth AND gate 1422 and a second level of fourth AND gate 1422. The high-bit summation module 143 includes two levels of adders 1431. The low-bit summation module 144 includes two levels of adders 1441.

An input end of the first NOT gate 1411 is configured to input the MSB, and an output end of the first NOT gate 1411 outputs inverse data MSB_B of the MSB. A first input end of the first level of third AND gate 1412 is configured to input the weight adjustment control data adj<1>, and a second input end of the first level of third AND gate 1412 is configured to input the MSB_B. An output end of the first level of third AND gate 1412 outputs the first level of high-bit weight adjustment code value a1. A first input end of the second level of third AND gate 1412 is configured to input the weight adjustment control data adj<2>, and a second input end of the second level of third AND gate 1412 is configured to input the MSB_B. An output end of the second level of third AND gate 1412 outputs the second level of high-bit weight adjustment code value a2.

An input end of the second NOT gate 1421 is configured to input the LSB, and an output end of the second NOT gate 1421 outputs inverse data LSB_B of the LSB. A first input end of the first level of fourth AND gate 1422 is configured to input the weight adjustment control data adj<1>, and a second input end of the first level of fourth AND gate 1422 is configured to input the LSB_B. An output end of the first level of fourth AND gate 1422 outputs the first level of low-bit weight code value b1. A first input end of the second level of fourth AND gate 1422 is configured to input the weight adjustment control data adj<2>, and a second input end of the second level of fourth AND gate 1422 is configured to input the LSB_B. An output end of the second level of fourth AND gate 1422 outputs the second level of low-bit weight adjustment code value b2.

A first input end of the first level of adder 1431 is configured to input MSB<7:1>, and a second input end of the first level of adder 1431 is configured to input 0,0,0,0,0, a2,0. An output end of the first level of adder outputs D0<7:1>. A first input end of the second level of adder 1431 is configured to input D0<7:1>, and a second input end of the second level of adder 1431 is configured to input 0,0,0,0,0,0, a1. An output end of the second level of adder 1431 outputs msb<7:1>.

A first input end of the first level of adder 1441 is configured to input LSB<7>, LSB<7:1>, and a second input end of the first level of adder 1441 is configured to input 0,0,0,0,0,0, b2,0. An output end of the first level of adder outputs D1<7:1>, that is, LSB<7:1> is summed with 0,0,0, 0,0, b2,0 for weight adjustment after being divided by 2. A first input end of the second level of adder 1441 is configured to input D1<7:1>, and a second input end of the second level of adder 1441 is configured to input 0,0,0,0,0,0,b1. An output end of the second level of adder 1441 outputs lsb<7:1>.

A first input end of the output summation module 145 is configured to input msb<m: 1>, and a second input end of the output summation module 145 is configured to input 1sb<m: 1>. The output summation module 145 is configured to perform full addition on 1sb<m: 1> and msb<m: 1> to obtain PAM4.

Referring to FIG. 1 and FIG. 4, the working principle of the multilevel output drive circuit is described in m=7 (7 bits digital mode) and n=2 (2 bits mode).

When adj<1:0> is 00 (that is, the eye height is not adjusted), the eye diagram is the same as described in the 1 bit mode.

When adj<1:0> is not 00 (that is, the eye height is adjusted), the following adjustment methods can be used.

35 When adj<1:0> is 01, the weights of the code values of the upper and lower eyes are increased by 1, and the middle eye does not change.

When adj<1:0> is 10, the weights of the code values of the upper and lower eyes are increased by 2, and the middle eye does not change.

When adj<1:0> is 11, the weights of the code values of the upper and lower eyes are increased by 3, and the middle eye does not change.

In addition, similar to the 1 bit mode, the 2-bit mode needs to satisfy co<7:1>+adj<1:0><42 to avoid the code value from overflowing.

Specific analysis is made below when co<7:1> is 38.

1) When adj<1:0>=00, and the value of co_polar is positive: 0,

C<7:1> and CB<7:1> output by the weight generation module 120 are 0100110 (38) and 1011010 (90) respectively; MSB<7:1> and LSB<7:1> are respectively 90 and 38; full addition operation is performed on MSB<7:1> (the value of which is 90 or 38) and LSB<7:1> (the value of which is 90 or 38) to obtain four states:

$$MSB + \frac{1}{2}LSB = 7, 45, 83, 121,$$

and $H_1$=38, $H_2$=38, and $H_3$=38.

Therefore, the three eyes are the same in size, and a relative eye height is 38 code values.

2) When adj<1:0>=01, and the value of co_polar is positive: 0,

C<7:1> and CB<7:1> output by the weight generation module 120 are 0100110 (38) and 1011010 (90) respectively; MSB<7:1> and LSB<7:1> are respectively 90 and 38; MSB<7:1> and LSB<7:1> are transmitted to the weight adjustment and data outputting module 140. The MSB is summed with adj<1> after being inverted, thus obtaining a1. The MSB is summed with adj<2> after being inverted, thus obtaining a2. The LSB is summed with adj<1> after being inverted, thus obtaining b2. The LSB is summed with adj<2> after being inverted, thus obtaining b2.

MSB<7:1> and 0,0,0,0,0,a2,0 are summed to obtain D0<7:1>; D0<7:1> and 0,0,0,0,0,0,a1 are summed to obtain msb<7:1>; LSB<7:1> is summed with 0,0,0,0,0,b2,0 after being divided by 2, thus obtaining D1<7:1>; and D1<7:1> and 0,0,0,0,0,0, b1 are summed to obtain 1sb<7:1>. msb<7: 1> and 1sb<7:1> are fully added to obtain four states:

$$MSB + \frac{1}{2}LSB = 7, 46, 84, 123,$$

and $H_1$=39, $H_2$=38, and $H_3$=39.

Compared with adj<1:0>=00, the weights of the middle two levels (46 and 84) are added by 1, and the weight of the highest level (123) is added by 2, that is, the weight code values of the upper and lower eyes are added by 1; and the middle eyes are unchanged.

3) When adj<1:0>=10, and the value of co_polar is positive: 0,

C<7:1> and CB<7:1> output by the weight generation module 120 are 0100110 (38) and 1011010 (90) respectively; MSB<7:1> and LSB<7:1> are respectively 90 and 38; MSB<7:1> and LSB<7:1> are transmitted to the weight adjustment and data outputting module 140. The MSB is summed with adj<1> after being inverted, thus obtaining a1. The MSB is summed with adj<2> after being inverted, thus obtaining a2. The LSB is summed with adj<1> after being inverted, thus obtaining b2. The LSB is summed with adj<2> after being inverted, thus obtaining b2.

MSB<7:1> and 0,0,0,0,0,a2,0 are summed to obtain D0<7:1>; D0<7:1> and 0,0,0,0,0,0,a1 are summed to obtain msb<7:1>; LSB<7:1> is summed with 0,0,0,0,0,b2,0 after being divided by 2, thus obtaining D1<7:1>; and D1<7:1> and 0,0,0,0,0,0, b1 are summed to obtain 1sb<7:1>. msb<7: 1> and 1sb<7:1> are fully added to obtain four states:

$$MSB + \frac{1}{2}LSB = 7, 47, 85, 125,$$

and $H_1$=40, $H_2$=38, and $H_3$=40.

Compared with adj<1:0>=00, the weights of the middle two levels (47 and 85) are added by 2, and the weight of the highest level (125) is added by 4, that is, the weight code values of the upper and lower eyes are added by 2; and the middle eyes are unchanged.

4) When adj<1:0>=11, and the value of co_polar is positive: 0,

C<7:1> and CB<7:1> output by the weight generation module 120 are 0100110 (38) and 1011010 (90) respectively; MSB<7:1> and LSB<7:1> are respectively 90 and 38; MSB<7:1> and LSB<7:1> are transmitted to the weight adjustment and data outputting module 140. The MSB is summed with adj<1> after being inverted, thus obtaining a1. The MSB is summed with adj<2> after being inverted, thus obtaining a2. The LSB is summed with adj<1> after being inverted, thus obtaining b2. The LSB is summed with adj<2> after being inverted, thus obtaining b2.

MSB<7:1> and 0,0,0,0,0,a2,0 are summed to obtain D0<7:1>; D0<7:1> and 0,0,0,0,0,0,a1 are summed to obtain msb<7:1>; LSB<7:1> and 0,0,0,0,0,b2,0 are summed to obtain D1<7:1>; and D1<7:1> and 0,0,0,0,0,0,b1 are summed to obtain 1sb<7:1>. msb<7:1> and 1sb<7:1> are fully added to obtain four states:

$$MSB + \frac{1}{2}LSB = 7, 48, 86, 127,$$

and $H_1$=41, $H_2$=38, and $H_3$=41.

Compared with adj<1:0>=00, the weights of the middle two levels (48 and 86) are added by 3, and the weight of the highest level (127) is added by 6, that is, the weight code values of the upper and lower eyes are added by 3; and the middle eyes are unchanged.

Therefore, by means of summing the MSB with the control bits 0,0,0,0,0, a2, a1 with weight adjustment code value information, LSB is divided by 2 and is then summed with the control bits 0,0,0,0,0, b2, b1 with weight adjustment code value information, a binary data signal msb<7:1>/ 1sb<7:1> with weight adjustment code value information is finally obtained, and 1sb<7:1> and msb<7:1> are fully added to finally output MSB and ½*LSB signals with adjustable code value weights. It can be seen from the above analysis that this embodiment of the present disclosure transmits data signals in the form of binary, in which the change of a transmission level corresponding to one code value is very small, allowing more accurate fine adjustment of the eye diagram. The 2 bit weight adjustment mode structure provided by this embodiment of the present disclosure achieves decrease the eye height in the middle eye diagram and increase the eye height in the upper and lower eye diagrams.

Figure 5:
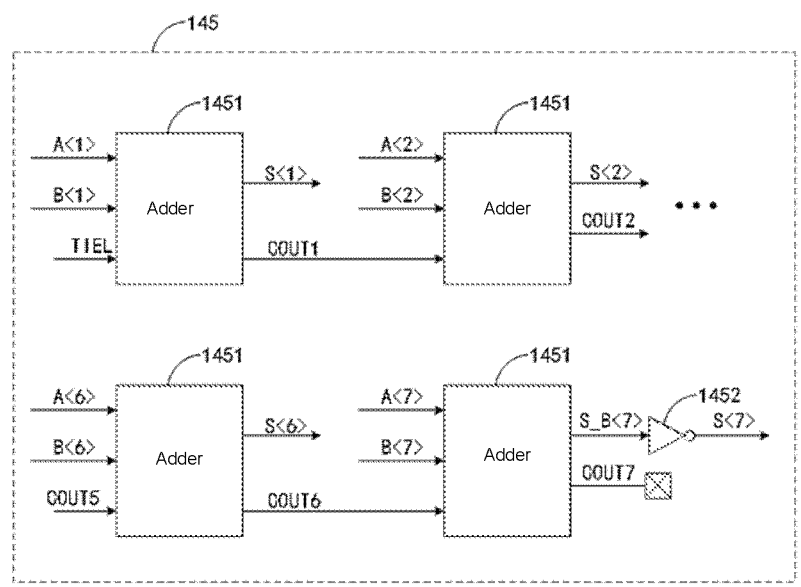
FIG. 5 is a schematic structural diagram of an output summation module provided by an embodiment of the present disclosure.

FIG. 5 is a schematic structural diagram of an output summation module provided by an embodiment of the present disclosure. As shown in FIG. 5, in an embodiment, the output summation module 145 is a full adder, and the output summation module 145 includes m levels of adders 1451 and a third NOT gate 1452. m=7 is taken as an example. A summand input end of the first level of adder 1451 is configured to input data A<1>; a summand input end of the first level of adder 1451 is configured to input data B<1>; a carry input end of the first level of adder 1451 is configured to input data TIEL; a standard sum output end of the first level of adder 1451 outputs data S<1>; a carry output end of the first level of adder 1451 outputs data COUT1; a summand input end of the second level of adder 1451 is configured to input data A<2>; a summand input end of the second level of adder 1451 is configured to input data B<2>; a carry input end of the second level of adder 1451 is configured to input data COUT1; a standard sum output end of the second level of adder 1451 outputs data S<2>; a carry output end of the second level of adder 1451 outputs data COUT2; . . . ; a summand input end of the sixth level of adder 1451 is configured to input data A<6>; a summand input end of the sixth level of adder 1451 is configured to input data B<6>; a carry input end of the sixth level of adder 1451 is configured to input data COUT5; a standard sum output end of the sixth level of adder 1451 outputs data S<6>; a carry output end of the sixth level of adder 1451 outputs data COUT6; a summand input end of the seventh level of adder 1451 is configured to input data A<7>; a summand input end of the seventh level of adder 1451 is configured to input data B<7>; a carry input end of the seventh level of adder 1451 is configured to input data COUT6; a standard sum output end of the seventh level of adder 1451 outputs data S_B<7>; a carry output end of the seventh level of adder 1451 outputs data COUT7; an input end of the third NOT gate 1452 is configured to input S_B<7>; an output end of the third NOT gate 1452 outputs S<7>; and the high-bit negation is performed on the obtained 7 bits of binary data to obtain PAM4.

Figure 6:
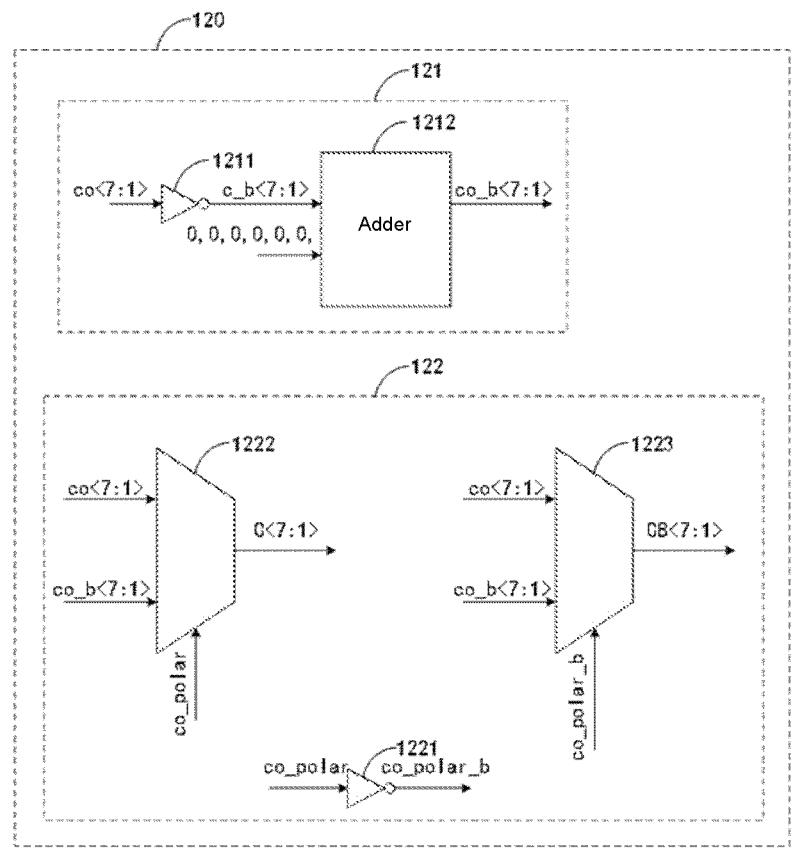
FIG. 6 is a schematic structural diagram of a weight generation module provided by an embodiment of the present disclosure.

FIG. 6 is a schematic structural diagram of a weight generation module provided by an embodiment of the present disclosure. Referring to FIG. 6, in an embodiment, the weight generation module 120 includes a complement generation sub module 121 and a weight selection sub module 122. A first input end of the complement generation sub module 121 is configured to input co<m: 1>, and a second input end of the complement generation sub module 121 is configured to input $$\underbrace{0, \ldots, 0}_{m},$$

1. An output end of the complement generation sub module 121 outputs a complement co_b<m: 1> of co<m: 1>. A control end of the weight selection sub module 122 is configured to input co_polar; a first data input end of the weight selection sub module 122 is configured to input co<m: 1>; a second data input end of the weight selection sub module 122 is configured to input co_b<m: 1>; a first data output end of the weight selection sub module 122 outputs C<m: 1>; a second data output end of the weight selection sub module 122 outputs CB<m: 1>; C<m: 1> is co<m: 1> or co_b<m: 1>; and CB<m: 1> is co_B<m: 1> or co<m: 1>. co_polar controls a positional relationship between C<m: 1> and CB<m: 1>.

Referring to FIG. 6, in an embodiment, the complement generation sub module 121 includes a fourth NOT gate 1211 and an adder 1212. An input end of the fourth NOT gate 1211 is configured to input co<m: 1>, and an output end of the fourth NOT gate 1211 outputs c_b<m: 1>; a first input end of the adder 1212 is configured to input c_B<m: 1>; a second input end of the adder 1212 is configured to input $$\underbrace{0,\ldots,0}_{m},$$

1; and an output end of the adder 1212 outputs co_b<m:1>.

The weight selection sub module 122 includes a fifth NOT gate 1221, a selector 1222 and a selector 1223; an input end of the fifth NOT gate 1221 is configured to input co_polar; an output end of the fifth NOT gate 1221 outputs co_polar_b; a control end of the selector 1222 is configured to input co_polar; a first input end of the selector 1222 is configured to input co<m: 1>; a second input end of the selector 1222 is configured to input co_b<m: 1>; an output end of the selector 1222 outputs C<m: 1>; a control end of the selector 1223 is configured to input co_polar b; a first input end of the selector 1222 is configured to input co<m: 1>, and a second input end of the selector 1222 is configured to input co_b<m: 1>; and an output end of the selector 1222 outputs CB<m: 1>.

For example, in a case of m=7, an input end of the fourth NOT gate 1211 is configured to input co<7:1>; an output end of the fourth NOT gate 1211 outputs c_b<7:1>; a first input end of the adder 1212 is configured to input c_b<7:1>; a second input end of the adder 1212 is configured to input 0,0,0,0,0,0,1; and an output end of the adder 1212 outputs co_b<7:1>. A control end of the selector 1222 is configured to input co_polar; a first input end of the selector 1222 is configured to input co<7:1>; a second input end of the selector 1222 is configured to input co_b<7:1>; an output end of the selector 1222 outputs C<7:1>; a control end of the selector 1223 is configured to input co_polar_b; a first input end of the selector 1222 is configured to input co<7:1>; a second input end of selector 1222 is configured to input co_b<7:1>; and an output end of the selector 1222 outputs CB<7:1>.

To sum up, this embodiment of the present disclosure adopts a DAC digital mode to realize the weight adjustment. By means of setting the weight adjustment and data outputting module in the multilevel output drive circuit to perform weight adjustment and pulse amplitude modulation calculation on the data MSB<m: 1>/LSB<m: 1> containing weight information, thus achieving the objective of adjusting the level of the generated pulse amplitude modulation data. Compared with simulated eye diagram adjustment, this embodiment of the present disclosure can not only decrease the eye height in the middle eye diagram, but also increase the eye height in the upper and lower eye diagram, which can more widely deal with the problem of imbalance of the RLM of the eye diagram caused by different transmission environments. In addition, this embodiment of the present disclosure transmits data signals in the form of binary, in which the change of a transmission level corresponding to one code value is very small, allowing more accurate fine adjustment of the eye diagram. In addition, the calculation process in the principle of this embodiment of the present disclosure has no requirement on the transmission rate, and the power consumption is determined by the rate of the signal to be transmitted. The adjustment process does not have additional power consumption, and the calculation requirement is low.

Figure 7:
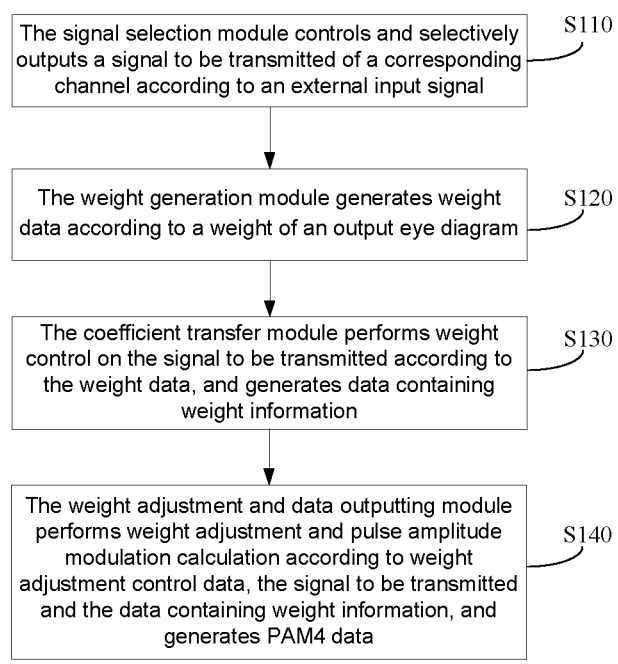
FIG. 7 is a flow diagram of a multilevel output drive method provided by an embodiment of the present disclosure.

An embodiment of the present disclosure further provides a multilevel output drive method, applicable to the multilevel output drive circuit provided by any embodiment of the present disclosure. FIG. 7 is a flow diagram of a multilevel output drive method provided by an embodiment of the present disclosure. Referring to FIG. 7, the multilevel output drive method includes the following steps:

S110, the signal selection module controls and selectively outputs a signal to be transmitted of a corresponding channel according to an external input signal.

S120, the weight generation module generates weight data according to a weight of an output eye diagram.

S130, the coefficient transfer module performs weight control on the signal to be transmitted according to the weight data, and generates data containing weight information.

S140, the weight adjustment and data outputting module performs weight adjustment and pulse amplitude modulation calculation according to weight adjustment control data, the signal to be transmitted and the data containing weight information, and generates PAM4 data.

This embodiment of the present disclosure adopts a DAC digital mode to realize the weight adjustment. By means of setting the weight adjustment and data outputting module in the multilevel output drive circuit to perform weight adjustment and pulse amplitude modulation calculation on the data MSB<m: 1>/LSB<m: 1> containing weight information, thus achieving the objective of adjusting the level of the generated pulse amplitude modulation data. Compared with simulated eye diagram adjustment, this embodiment of the present disclosure can not only decrease the eye height in the middle eye diagram, but also increase the eye height in the upper and lower eye diagram, which can more widely deal with the problem of imbalance of the RLM of the eye diagram caused by different transmission environments. In addition, this embodiment of the present disclosure transmits data signals in the form of binary, in which the change of a transmission level corresponding to one code value is very small, allowing more accurate fine adjustment of the eye diagram. In addition, the calculation process in the principle of this embodiment of the present disclosure has no requirement on the transmission rate, and the power consumption is determined by the rate of the signal to be transmitted. The adjustment process does not have additional power consumption, and the calculation requirement is low.

In an embodiment, the signal to be transmitted includes an MSB and an LSB. The data containing weight information includes high-bit data MSB<m: 1> containing weight information and low-bit data LSB<m: 1> containing weight information; m is a natural number, m≥7, so as to convert MSB and LSB into higher-bit binary data and improve the accuracy of signal transmission.

In an embodiment, the weight adjustment and data outputting module includes a high-bit weight adjustment module, a low-bit weight adjustment module, a high-bit summation module, a low-bit summation module and an output summation module. The method further includes:

the high-bit weight adjustment module generates high-bit weight adjustment code values according to the MSB and the weight adjustment control data adj<n: 1>, and n is a positive integer;

the low-bit weight adjustment module generates low-bit weight adjustment code values according to the LSB and the weight adjustment control data adj<n: 1>;

the high-bit summation module recombines the high-bit weight adjustment code values with 0 to obtain m bits high-bit weight adjustment data, and sums MSB<m: 1> with the high-bit weight adjustment data to obtain a high-bit adjustment signal msb<m: 1>;

the low-bit summation module recombines the low-bit weight adjustment code values with 0 to obtain m bits low-bit weight adjustment data, and sums the LSB<m: 1> with the low-bit weight adjustment data to obtain a low-bit adjustment signal lsb<m: 1>; and the output summation module sums msb<m: 1> with lsb<m: 1> to obtain PAM4.

In the above embodiment, dividing the LSB by 2 can be performed before or after the weight adjustment of LSB<m: 1>, or after the weight adjustment of LSB<m: 1>, that is, lsb<m: 1> can be data after dividing LSB<m: 1> by 2 or data before dividing LSB<m: 1> by 2, which can be determined according to the value of n.

In an embodiment, n=1. The high-bit weight adjustment module includes a first AND gate. The low-bit weight adjustment module includes a second AND gate. The method further includes:

the first AND gate performs logic AND on the weight adjustment control data adj and the MSB to obtain a high-bit weight adjustment code value a;

the second AND gate performs logic AND on the weight adjustment control data adj and the LSB to obtain a low-bit weight adjustment code value b;

the high-bit summation module performs full addition on MSB<m: 1> and $$\underbrace{0, \ldots, 0}_{m},$$

a to obtain msb<m: 1>;

the low-bit summation module performs full addition on LSB<m: 1> and $$\underbrace{0, \ldots, 0}_{m},$$

b to obtain lsb<m: 1>; and the output summation module divides lsb<m: 1> by 2 and performs full addition on lsb<m: 1> and msb<m: 1> to obtain PAM4.

In an embodiment, n=1. The high-bit weight adjustment module includes a first AND gate. The low-bit weight adjustment module includes a second AND gate. The method further includes:

the first AND gate performs logic AND on the weight adjustment control data adj and the MSB to obtain a high-bit weight adjustment code value a;

the second AND gate performs logic AND on the weight adjustment control data adj and the LSB to obtain a low-bit weight adjustment code value b;

the high-bit summation module performs full addition on MSB<m: 1> and $$\underbrace{0, \ldots, 0}_{m},$$

a to obtain msb<m: 1>;

the low-bit summation module divides LSB<m: 1> by 2 and performs full addition on LSB<m: 1> and $$\underbrace{0, \ldots, 0}_{m},$$

b to obtain lsb<m: 1>; and the output summation module performs full addition on lsb<m: 1> and msb<m: 1> to obtain PAM4.

It can be seen that for n=1, the LSB can be divided by 2 performed before or after the weight adjustment of LSB<m: 1>. This is because for binary data, the lowest bit is 1. In the 1 bit mode, even if the LSB is divided by 2 after the weight adjustment of LSB<m: 1>, the weight adjustment bit is still 1, and the weight adjustment will not be affected by the division by 2.

In an embodiment, n≥2. The high-bit weight adjustment module includes a first NOT gate, a first level of third AND gate, . . . , an ith level of third AND gate, . . . , and an nth level of third AND gate, where i is a positive integer and 1<i<n. The low-bit weight adjustment module includes: a second NOT gate, a first level of fourth AND gate, . . . , an ith level of fourth AND gate, . . . , and an nth level fourth AND gate. The method further includes:

the first NOT gate inverts the MSB to obtain inverse data MSB_B of MSB;

the first level of third AND gate performs logic AND on the weight adjustment control data adj<1> and MSB_B to obtain a first level of high-bit weight adjustment code value a1;

the ith level of third AND gate performs logic AND on the weight adjustment control data adj<i> and MSB_B to obtain an ith level of high-bit weight adjustment code value ai;

the nth level of third AND gate performs logic AND on the weight adjustment control data adj<n> and MSB_B to obtain an nth level of high-bit weight adjustment code value a(n);

the second NOT gate inverts the LSB to obtain inverse data LSB_B of the LSB;

the first level of fourth AND gate performs logic AND on the weight adjustment control data adj<1> and LSB_B to obtain a first level of high-bit weight adjustment code value b1;

the ith level of fourth AND gate performs logic AND on the weight adjustment control data adj<i> and LSB_B to obtain an ith level of high-bit weight adjustment code value bi;

the nth level of fourth AND gate performs logic AND on the weight adjustment control data adj<n> and LSB_B to obtain an nth level of high-bit weight adjustment code value b(n);

the high-bit summation module performs full addition on MSB<m: 1> and $$\underbrace{0, \ldots, 0}_{m-n},$$

an, . . . , a1 to obtain msb<m: 1>;

the low-bit summation module divides LSB<m: 1> by 2 and performs full addition on LSB<m: 1> and $$\underbrace{0, \ldots, 0}_{m-n},$$

bn, . . . ,bi, . . . , b1 to obtain 1sb<m: 1>; and the sixth adder performs full addition on msb<m: 1> and 1sb<m: 1> to obtain PAM4.

In this embodiment of the present disclosure, in case of n≥2, the LSB is divided by 2 before the weight adjustment of LSB<m: 1>, which can avoid a deviation caused by the fact that: the low-bit weight adjustment code values bn, . . . , bi, . . . , b1 is divided by 2 when LSB<m: 1> is divided by 2, but the high-bit weight adjustment code values an, . . . , ai, . . . , a1 are not divided by 2.

In an embodiment, the signal selection module includes a first data selector and a second data selector. The method further includes:

the first data selector selectively outputs the MSB according to a high-bit selection control signal; and the second data selector selectively outputs the LSB according to a low-bit selection control signal.

In an embodiment, the multilevel output drive method also includes:

the weight generation module determines weight data according to initial weight data co<m: 1> and a weight polarity co_polar. The weight data includes a maximum weight code value C<m: 1> and a complement CB<m: 1> of C<m: 1>.

In an embodiment, the weight generation module includes a complement generation sub module and a weight selection sub module. The multilevel output drive method further includes:

the complement generation sub module inverts co<m: 1> and performs full addition on co<m: 1> and $$\underbrace{0, \ldots, 0,}_{m-1}$$

1 to obtain a complement co_b<m: 1> of co<m: 1>; and the weight selection sub module determines, according to co_polar, that the output C<m: 1> is co<m: 1> and the output CB<m: 1> is co_b<m: 1>; or, determines that the output C<m: 1> is co_b<m: 1> and the output CB<m: 1> is co<m: 1>.

10 In an embodiment, the coefficient transfer module includes a third data selector and a fourth data selector. The multilevel output drive method further includes:

the third data selector determines, according to the MSB, that the output MSB<m: 1> is C<m: 1> or CB<m: 1>; and the fourth data selector determines, according to the LSB, that the output LSB<m: 1> is C<m: 1> or CB<m: 1>.

It should be noted that the above descriptions are only preferred embodiments of the present disclosure and applied technical principles. Those skilled in the art will understand that the present disclosure is not limited to the specific embodiments described herein, and those skilled in the art can make various obvious changes, readjustments and substitutions without departing from the protection scope of the present disclosure. Therefore, although the present disclosure has been described in more detail through the above embodiments, the present disclosure is not limited to the above embodiments, and can also include more other equivalent embodiments without departing from the concept of the present disclosure. The scope of the present disclosure is determined by the scope of the appended claims.

What is claimed is:

1. A multilevel output drive circuit, comprising:
a signal selection module, configured to selectively output a signal to be transmitted of a corresponding channel according to an external input signal;
a weight generation module, configured to generate weight data according to a weight of an output eye diagram, wherein the weight of the output eye diagram and the weight data are multi-bit binary data;
a coefficient transfer module, configured to perform weight control on the signal to be transmitted according to the weight data and generate data containing weight information; and
a weight adjustment and data outputting module, configured to perform weight adjustment and pulse amplitude modulation calculation according to weight adjustment control data, the signal to be transmitted and the data containing weight information, and generate PAM4 data.

2. The multilevel output drive circuit according to claim 1, wherein the signal to be transmitted comprises a Most Significant Bit (MSB) and a Least Significant bit (LSB);
the data containing weight information comprises high-bit data MSB<m: 1> containing weight information and low-bit data LSB<m: 1> containing weight information; m is a natural number, and m≥7.

3. The multilevel output drive circuit according to claim 2, wherein the weight adjustment and data outputting module comprises:
a high-bit weight adjustment module, configured to generate a high-bit weight adjustment code value according to the MSB and the weight adjustment control data adj<n: 1>, wherein n is a positive integer;
a low-bit weight adjustment module, configured to generate a low-bit weight adjustment code value according to the LSB and the weight adjustment control data adj<n: 1>;
a high-bit summation module, configured to recombine the high-bit weight adjustment code value with 0 to obtain m bits high-bit weight adjustment data, and sum the MSB<m: 1> with the high-bit weight adjustment data to obtain a high-bit adjustment signal msb<m: 1>;
a low-bit summation module, configured to recombine the low-bit weight adjustment code value with 0 to obtain m bits low-bit weight adjustment data, and sum the LSB<m: 1> with the low-bit weight adjustment data to obtain a low-bit adjustment signal 1sb<m: 1>; and
an output summation module, configured to sum the msb<m: 1> with the 1sb<m: 1> to obtain the PAM4.

4. The multilevel output drive circuit according to claim 3, wherein n=1;
the high-bit weight adjustment module comprises a first AND gate; a first input end of the first AND gate is configured to input the weight adjustment control data adj, and a second input end of the first AND gate is configured to input the MSB; an output end of the first AND gate outputs the high-bit weight adjustment code value a;
the low-bit weight adjustment module comprises a second AND gate; a first input end of the second AND gate is configured to input the weight adjustment control data adj, and a second input end of the second AND gate is configured to input the LSB; and an output end of the second AND gate outputs the low-bit weight adjustment code value b.

5. The multilevel output drive circuit according to claim 4, wherein a first input end of the high-bit summation module is configured to input the MSB<m: 1>, and a second input end of the high-bit summation module is configured to input $$\underbrace{0, \ldots, 0,}_{m-1}$$

a; an output end of the high-bit summation module outputs the msb<m: 1>;

a first input end of the low-bit summation module is configured to input the LSB<m: 1>; a second input end of the low-bit summation module is configured to input $$\underbrace{0, \ldots, 0,}_{m-1}$$

b, and an output end of the low-bit summation module outputs the lsb<m: 1>;

a first input end of the output summation module is configured to input the msb<m: 1>, and a second input end of the output summation module is configured to input the lsb<m: 1>; and the output summation module is configured to perform, after the lsb<m: 1> is divided by 2, full addition on the lsb<m: 1> and the msb<m: 1> to obtain the PAM4.

6. The multilevel output drive circuit according to claim 4, wherein a first input end of the high-bit summation module is configured to input the MSB<m: 1>, and a second input end of the high-bit summation module is configured to input $$\underbrace{0, \ldots, 0,}_{m-1}$$

a; an output end of the high-bit summation module outputs the msb<m: 1>;

a first input end of the low-bit summation module is configured to input LSB<m> and LSB<m: 1>; a second input end of the low-bit summation module is configured to input $$\underbrace{0, \ldots, 0,}_{m-1}$$

b; the low-bit summation module is configured to sum the LSB<m: 1> with $$\underbrace{0, \ldots, 0,}_{m-1}$$

b after division by 2; an output end of the low-bit summation module outputs the lsb<m: 1>;

a first input end of the output summation module is configured to input the msb<m: 1>, and a second input end of the output summation module is configured to input the lsb<m: 1>; and the output summation module is configured to perform full addition on the lsb<m: 1> and the msb<m: 1> to obtain the PAM4.

7. The multilevel output drive circuit according to claim 3, wherein n>2;

the high-bit weight adjustment module comprises:

a first NOT gate, an input end of the first NOT gate is configured to input the MSB, and an output end of the first NOT gate outputting inverse data MSB_B of the MSB;

a first level of third AND gate, a first input end of the first level of third AND gate being configured to input the weight adjustment control data adj<1>, a second input end of the first level of third AND gate is configured to input the MSB_B, and an output end of the first level of third AND gate outputting a first level of high-bit weight adjustment code value a1;

an ith level of third AND gate, a first input end of the ith level of third AND gate is configured to input the weight adjustment control data adj<i>, a second input end of the ith level of third AND gate is configured to input the MSB_B, and an output end of the ith level of third AND gate outputting an ith level of high-bit weight adjustment code value ai, wherein i is a positive integer, and 1≤ i≤n;

an nth level of third AND gate, a first input of the nth level of third AND gate is configured to input the weight adjustment control data adj<n>, a second input of the nth level of third AND gate is configured to input the MSB_B, and an output end of the nth level of third AND gate outputting an nth level of high-bit weight adjustment code value a (n);

the low-bit weight adjustment module comprises:

a second NOT gate, an input end of the second NOT gate is configured to input the LSB, and an output end of the first NOT gate outputting inverse data LSB_B of the LSB;

a first level of fourth AND gate, a first input end of the first level of fourth AND gate is configured to input the weight adjustment control data adj<1>, a second input end of the first level of fourth AND gate is configured to input the LSB_B, and an output end of the first level of fourth AND gate outputting a first level of low-bit weight adjustment code value b1;

an ith level of third AND gate, a first input end of the ith level of fourth AND gate is configured to input the weight adjustment control data adj<i>, a second input end of the ith level of fourth AND gate being configured to input the LSB_B, and an output end of the ith level of fourth AND gate outputting an ith level of low-bit weight adjustment code value bi, wherein i is a positive integer, and 1≤i≤n; and an nth level of fourth AND gate, a first input of the nth level of fourth AND gate is configured to input the weight adjustment control data adj<n>, a second input of the nth level of fourth AND gate is configured to input the LSB_B, and an output end of the nth level of fourth AND gate outputting an nth level of low-bit weight adjustment code value b (n).

8. The multilevel output drive circuit according to claim 7, wherein a first input end of the high-bit summation module is configured to input the MSB<m: 1>, and a second input end of the high-bit summation module is configured to input $$\underbrace{0,\ldots,0,}_{m-n}$$

an, ..., ai, ..., a1; an output end of the high-bit summation module outputs the msb<m: 1>;
a first input end of the low-bit summation module is configured to input LSB<m> and LSB<m: 1>; a second input end of the low-bit summation module is configured to input $$\underbrace{0,\ldots,0,}_{m-n}$$

bn, ...,
bi, ..., b1; the low-bit summation module is configured to sum the LSB<m: 1> with $$\underbrace{0,\ldots,0,}_{m-n}$$

bn, ..., bi, ..., b1 after division by 2; an output end of the low-bit summation module outputs the 1sb<m: 1>;
a first input end of the output summation module is configured to input the msb<m: 1>, and a second input end of the output summation module is configured to input the 1sb<m: 1>; and the output summation module is configured to perform full addition on the 1sb<m: 1> and the msb<m: 1> to obtain the PAM4.

9. The multilevel output drive circuit according to claim 2, wherein the signal selection module comprises:
a first data selector, a control end of the first data selector is configured to input a high-bit selection control signal, a first data input end of the first data selector is configured to input the MSB, a second data input end of the first data selector is configured to input the LSB, and an output end of the first data selector outputting the MSB;
a second data selector, a control end of the second data selector is configured to input a low-bit selection control signal, a first data input end of the second data selector is configured to input the MSB, a second data input end of the second data selector is configured to input the LSB, and an output end of the second data selector outputting the MSB.

10. The multilevel output drive circuit according to claim 2, wherein the weight generation module is configured to determine the weight data according to initial weight data co<m: 1> and a weight polarity co_polar; and the weight data comprises a maximum weight code value C<m: 1> and a complete CB<m: 1> of the C<m: 1>.

11. The multilevel output drive circuit according to claim 10, wherein the weight generation module comprises:
a complement generation sub module, a first input end of the complement generation sub module is configured to input co<m: 1>, a second input end of the complement generation sub module is configured to input $$\underbrace{0,\ldots,0,}_{m-1}$$

1, and an output end of the complement generation sub module outputting a complement co_b<m: 1> of co<m: 1>;
a weight selection sub module, a control end of the weight selection sub module is configured to input the co_polar, a first data input end of the weight selection sub module is configured to input the co<m: 1>, a second data input end of the weight selection sub module is configured to input the co_b<m: 1>, a first data output end of the weight selection sub module outputting the C<m: 1>, and a second data output end of the weight selection sub module outputting the CB<m: 1>, wherein the C<m: 1> is the co<m: 1> or the co_b<m: 1>; and the CB<m: 1> is the co_B<m: 1> or the co<m: 1>;
or
a third data selector, a control end of the third data selector is configured to input the MSB, a first data input end of the third data selector is configured to input the C<m: 1>, a second data input end of the third data selector is configured to input the CB<m: 1>, and an output end of the third data selector outputting the MSB<m: 1>, wherein the MSB<m: 1> is the C<m: 1> or the CB<m: 1>;
a fourth data selector, a control end of the fourth data selector is configured to input the LSB, a first data input end of the fourth data selector is configured to input the C<m: 1>, a second data input end of the fourth data selector is configured to input the CB<m: 1>, and an output end of the fourth data selector outputting the LSB<m: 1>, wherein the LSB<m: 1> is the C<m: 1> or the CB<m: 1>.

12. A multilevel output drive method, applied to a signal selection module, a weight generation module, a coefficient transfer module and a weight adjustment and data outputting module, the method comprising:
controlling and selectively outputting, by the signal selection module, a signal to be transmitted of a corresponding channel according to an external input signal;
generating, by the weight generation module, weight data according to a weight of an output eye diagram, wherein the weight of the output eye diagram and the weight data are multi-bit binary data;
performing, by the coefficient transfer module, weight control on the signal to be transmitted according to the weight data, and generating data containing weight information; and
performing, by the weight adjustment and data outputting module, weight adjustment and pulse amplitude modulation calculation according to weight adjustment control data, the signal to be transmitted and the data containing weight information, and generate PAM4 data.

13. The multilevel output drive method according to claim 12, wherein
the signal to be transmitted comprises a Most Significant Bit (MSB) and a Least Significant bit (LSB);
the data containing weight information comprises high-bit data MSB<m: 1> containing weight information and low-bit data LSB<m: 1> containing weight information; m is a natural number, and m≥7.

14. The multilevel output drive method according to claim 13, wherein the weight adjustment and data outputting module comprises a high-bit weight adjustment module, a low-bit weight adjustment module, a high-bit summation module, a low-bit summation module and an output summation module; and the method further comprises:

the high-bit weight adjustment module generates a high-bit weight adjustment code value according to the MSB and the weight adjustment control data adj<n: 1>, wherein n is a positive integer;

the low-bit weight adjustment module generates a low-bit weight adjustment code value according to the LSB and the weight adjustment control data adj<n: 1>;

the high-bit summation module recombines the high-bit weight adjustment code value with 0 to obtain m bits high-bit weight adjustment data, and sums MSB<m: 1> with the high-bit weight adjustment data to obtain a high-bit adjustment signal msb<m: 1>;

the low-bit summation module recombines the low-bit weight adjustment code value with 0 to obtain m bits low-bit weight adjustment data, and sums the LSB<m: 1> with the low-bit weight adjustment data to obtain a low-bit adjustment signal lsb<m: 1>; and the output summation module sums msb<m: 1> with lsb<m: 1> to obtain PAM4.

15. The multilevel output drive method according to claim 14, wherein n=1; the high-bit weight adjustment module comprises a first AND gate; the low-bit weight adjustment module comprises a second AND gate; the method further comprises:

the first AND gate performs logic AND on the weight adjustment control data adj and the MSB to obtain the high-bit weight adjustment code value a;

the second AND gate performs logic AND on the weight adjustment control data adj and the LSB to obtain the low-bit weight adjustment code value b;

the high-bit summation module performs full addition on the MSB<m: 1> and $$\underbrace{0, \ldots, 0,}_{m}$$

a to obtain the msb<m: 1>;

the low-bit summation module performs full addition on the LSB<m: 1> and $$\underbrace{0, \ldots, 0,}_{m}$$

b to obtain the lsb<m: 1>; and the output summation module divides the lsb<m: 1> by 2 and performs full addition on the lsb<m: 1> and the msb<m: 1> to obtain the PAM4.

16. The multilevel output drive method according to claim 14, wherein n=1; the high-bit weight adjustment module comprises a first AND gate; the low-bit weight adjustment module comprises a second AND gate; the method further comprises:

the first AND gate performs logic AND on the weight adjustment control data adj and the MSB to obtain the high-bit weight adjustment code value a;

the second AND gate performs logic AND on the weight adjustment control data adj and the LSB to obtain the low-bit weight adjustment code value b;

the high-bit summation module performs full addition on the MSB<m: 1> and $$\underbrace{0, \ldots, 0,}_{m}$$

a to obtain the msb<m: 1>;

the low-bit summation module divides the LSB<m: 1> by 2 and performs full addition on the LSB<m: 1> and $$\underbrace{0, \ldots, 0,}_{m-1}$$

b to obtain the lsb<m: 1>; and the output summation module performs full addition on the lsb<m: 1> and the msb<m: 1> to obtain the PAM4.

17. The multilevel output drive method according to claim 14, wherein n≥2; the high-bit weight adjustment module comprises a first NOT gate, a first level of third AND gate, . . . , an ith level of third AND gate, . . . , and an nth level of third AND gate; i is a positive integer and 1≤i≤n; the low-bit weight adjustment module comprises a second NOT gate, a first level of fourth AND gate, . . . , an ith level of fourth AND gate, . . . , and an nth level fourth AND gate; and the method further comprises:

the first NOT gate inverts the MSB to obtain inverse data MSB_B of the MSB;

the first level of third AND gate performs logic AND on the weight adjustment control data adj<1> and he MSB_B to obtain a first level of high-bit weight adjustment code value a1;

the ith level of third AND gate performs logic AND on the weight adjustment control data adj<i> and the MSB_B to obtain an ith level of high-bit weight adjustment code value ai;

the nth level of third AND gate performs logic AND on the weight adjustment control data adj<n> and the MSB_B to obtain an nth level of high-bit weight adjustment code value $a_n$;

the second NOT gate inverts the LSB to obtain inverse data LSB_B of the LSB;

the first level of fourth AND gate performs logic AND on the weight adjustment control data adj<1> and the LSB_B to obtain a first level of high-bit weight adjustment code value b1;

the ith level of fourth AND gate performs logic AND on the weight adjustment control data adj<i> and the LSB_B to obtain an ith level of high-bit weight adjustment code value bi;

the nth level of fourth AND gate performs logic AND on the weight adjustment control data adj<n> and the LSB_B to obtain an nth level of high-bit weight adjustment code value $b_n$;

the high-bit summation module performs full addition on the MSB<m: 1> and $$\underbrace{0, \ldots, 0,}_{m-n}$$

an, . . . , ai, . . . , a1 to obtain the msb<m: 1>;

the low-bit summation module divides the LSB<m: 1> by 2 and performs full addition on the LSB<m: 1> and $$\underbrace{0, \ldots, 0,}_{m-n}$$

bn, . . . , bi, . . . , b1 to obtain the lsb<m: 1>; and the output summation module performs full addition on the msb<m: 1> and the lsb<m: 1> to obtain the PAM4.

18. The multilevel output drive method according to claim 13, wherein the signal selection module comprises a first data selector and a second data selector; the method further comprises:
- the first data selector selectively outputs the MSB according to a high-bit selection control signal; and
- the second data selector selectively outputs the LSB according to a low-bit selection control signal.

19. The multilevel output drive method according to claim 13, further comprising:
- the weight generation module determines the weight data according to initial weight data co<m: 1> and a weight polarity co_polar; and the weight data comprises a maximum weight code value C<m: 1> and a complement CB<m: 1> of the C<m: 1>.

20. The multilevel output drive method according to claim 19, wherein the weight generation module comprises a complement generation sub module and a weight selection sub module; and the method further comprises:
- the complement generation sub module inverts the co<m: 1> and performs full addition on the co<m: 1> and $\underbrace{0, \ldots, 0}_{m-1}$, 1 to obtain a complement co_b<m: 1> of the co<m: 1>; and
- the weight selection sub module determines, according to the co_polar, that the output C<m: 1> is the co<m: 1> and the output CB<m: 1> is the co_b<m: 1>; or, determines that the output C<m: 1> is the co_b<m: 1> and the output CB<m: 1> is the com: 1>;

or

- the third data selector determines, according to the MSB, that the output MSB<m: 1> is the C<m: 1> or the CB<m: 1>; and
- the fourth data selector determines, according to the LSB, that the output LSB<m: 1> is the C<m: 1> or the CB<m: 1>.

\* \* \* \* \*